(12) United States Patent
Mazzella et al.

(10) Patent No.: US 12,323,098 B2
(45) Date of Patent: Jun. 3, 2025

(54) PHOTOVOLTAIC CONVERTER

(71) Applicant: ENI S.P.A., Rome (IT)

(72) Inventors: Cosimo Mazzella, San Donato (IT); Giacomo Gorni, San Donato (IT); Donato Vincenzi, Ferrara (IT); Paolo Bernardoni, Ferrara (IT)

(73) Assignee: ENI S.P.A., Rome (IT)

( * ) Notice: Subject to any disclaimer, the term of this patent is extended or adjusted under 35 U.S.C. 154(b) by 70 days.

(21) Appl. No.: 17/916,470

(22) PCT Filed: Mar. 30, 2021

(86) PCT No.: PCT/IB2021/052616
§ 371 (c)(1),
(2) Date: Sep. 30, 2022

(87) PCT Pub. No.: WO2021/198900
PCT Pub. Date: Oct. 7, 2021

(65) Prior Publication Data
US 2023/0144923 A1    May 11, 2023

(30) Foreign Application Priority Data

Mar. 30, 2020 (IT) ........................ 102020000006622

(51) Int. Cl.
*H02S 40/36* (2014.01)
*H10F 19/90* (2025.01)

(52) U.S. Cl.
CPC ........... *H02S 40/36* (2014.12); *H10F 19/904* (2025.01)

(58) Field of Classification Search
None
See application file for complete search history.

(56) References Cited

U.S. PATENT DOCUMENTS

| | | | |
|---|---|---|---|
| 4,718,185 A * | 1/1988 | Conlin | H02S 40/38 320/155 |
| 9,369,084 B2 | 6/2016 | Oikawa et al. | |
| 2008/0194154 A1 | 8/2008 | Minnick | |
| 2011/0240084 A1 | 10/2011 | Lai et al. | |
| 2012/0013191 A1* | 1/2012 | Jeandeaud | H02S 40/34 136/252 |
| 2012/0324808 A1 | 12/2012 | Reyal et al. | |

(Continued)

FOREIGN PATENT DOCUMENTS

| | | |
|---|---|---|
| DE | 10 2010 003 466 A1 | 10/2011 |
| DE | 11 2014 002 360 T5 | 1/2016 |

OTHER PUBLICATIONS

International Search Report and Written Opinion dated Jun. 11, 2021 from International Patent Application No. PCT/IB2021/052616, 17 pages.

*Primary Examiner* — Ryan S Cannon
(74) *Attorney, Agent, or Firm* — Ruggiero McAllister & McMahon LLC

(57) ABSTRACT

A photovoltaic converter for electric power generating panels includes photovoltaic modules. Each photovoltaic module has a substrate, extending along a main direction from a first end to a second end, and a photovoltaic devices, arranged on the substrate in succession along the main direction. The photovoltaic converter further includes at least a bridge module insertion-connecting a respective upstream photovoltaic module and a respective downstream photovoltaic module.

14 Claims, 5 Drawing Sheets

(56) References Cited

U.S. PATENT DOCUMENTS

| | | |
|---|---|---|
| 2013/0068277 A1 | 3/2013 | Kataoka et al. |
| 2015/0221798 A1* | 8/2015 | Ohhashi ............... H01L 31/055 |
| | | 136/247 |
| 2015/0311371 A1* | 10/2015 | Krishnamoorthy ..... H02S 40/36 |
| | | 29/25.01 |

* cited by examiner

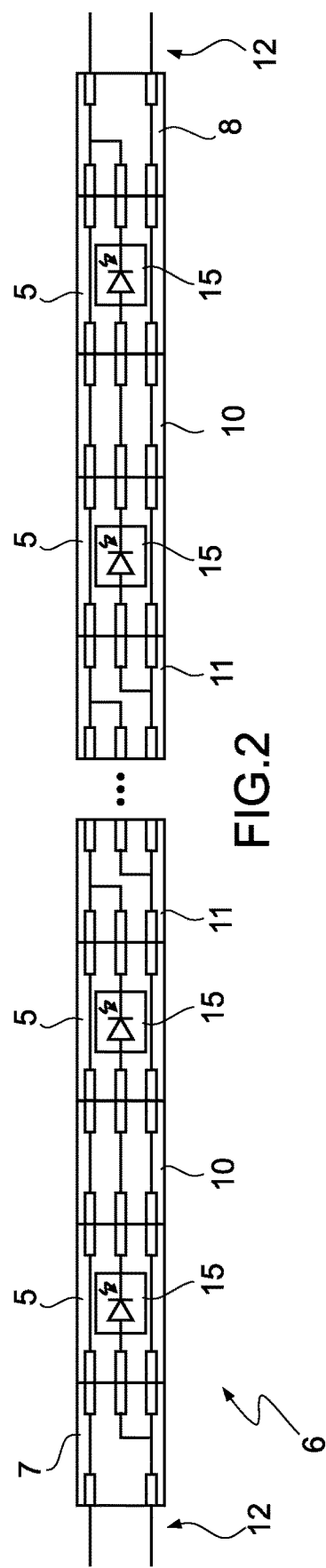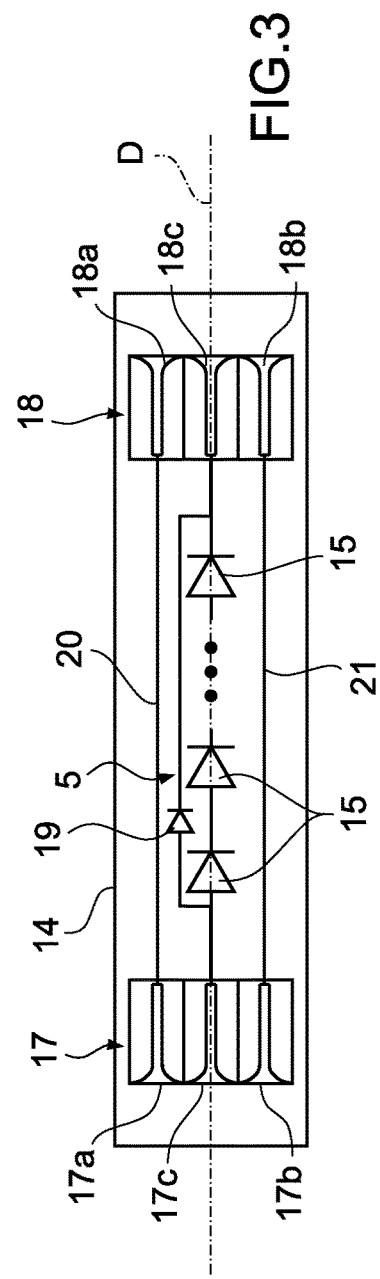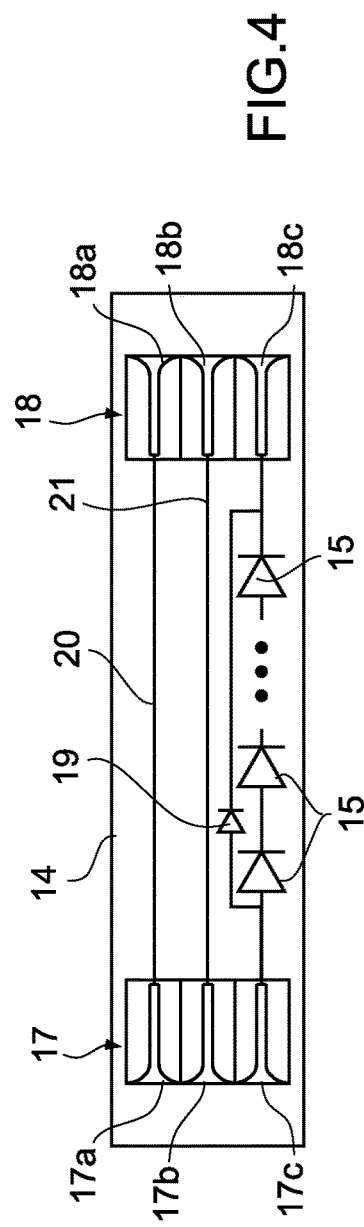

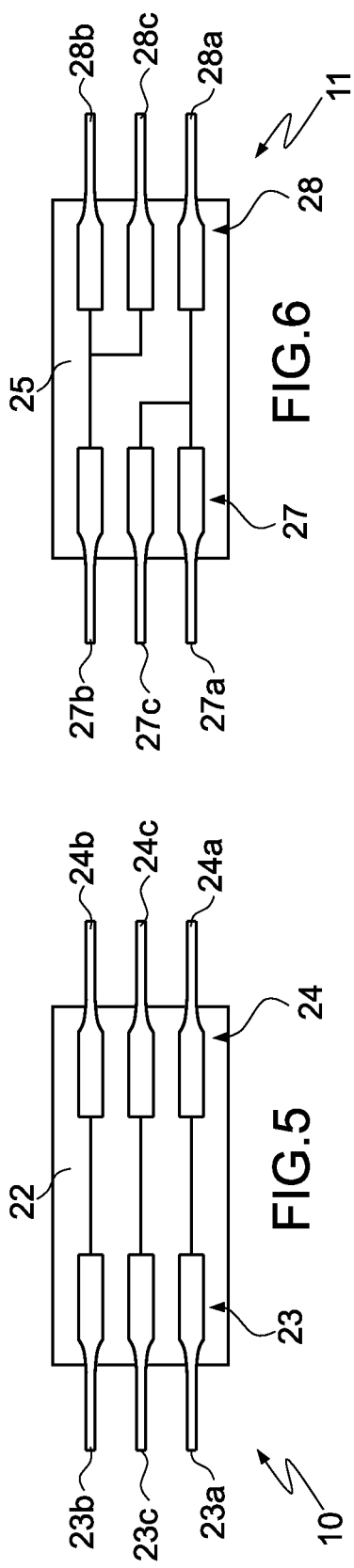
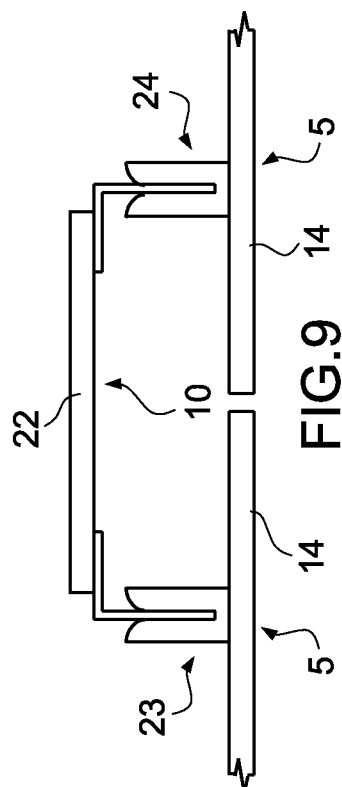
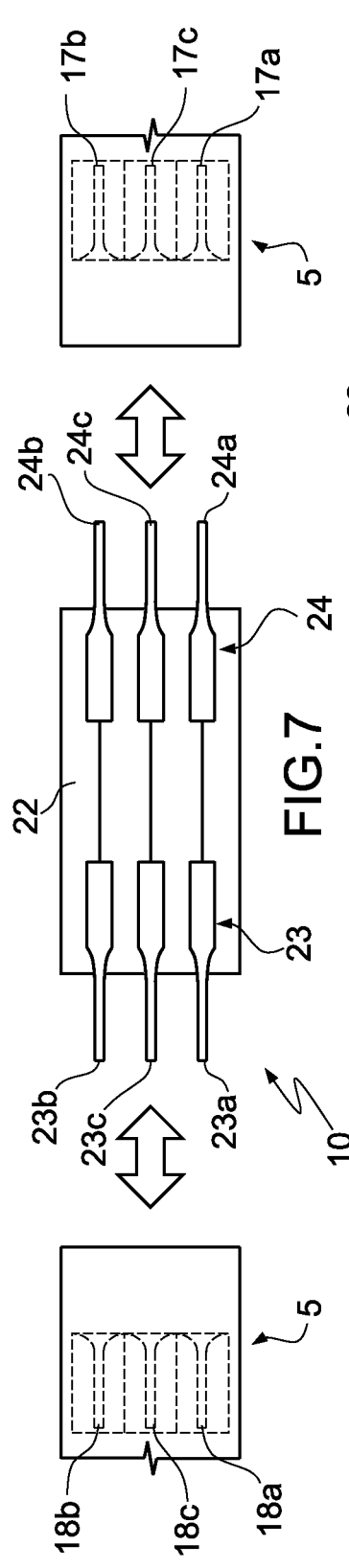
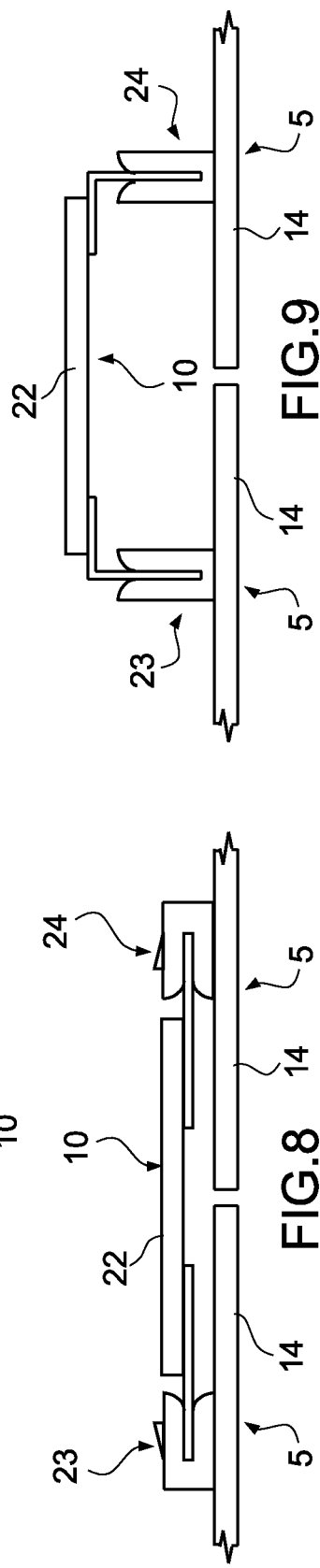
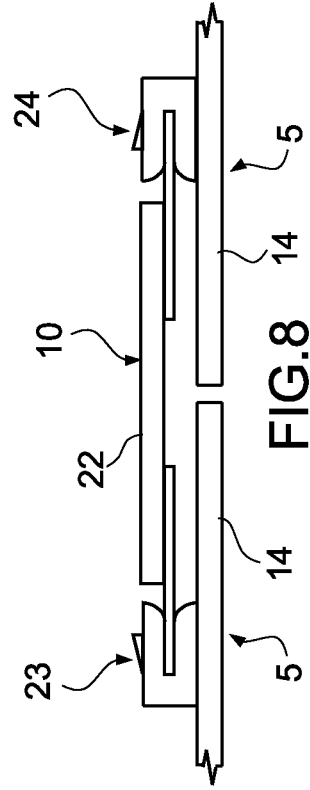

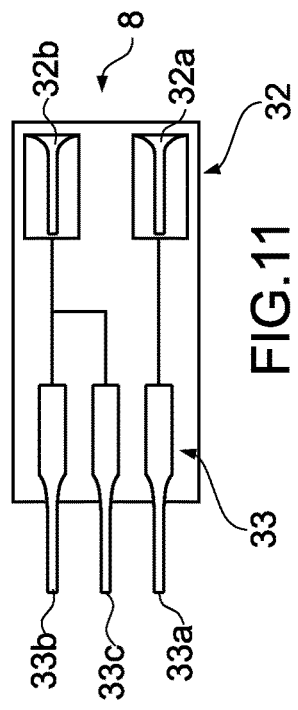
FIG.10
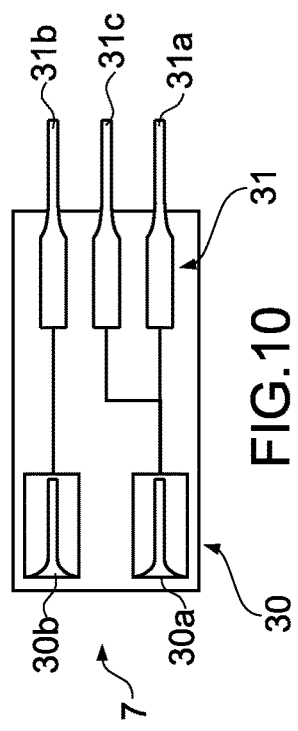
FIG.11
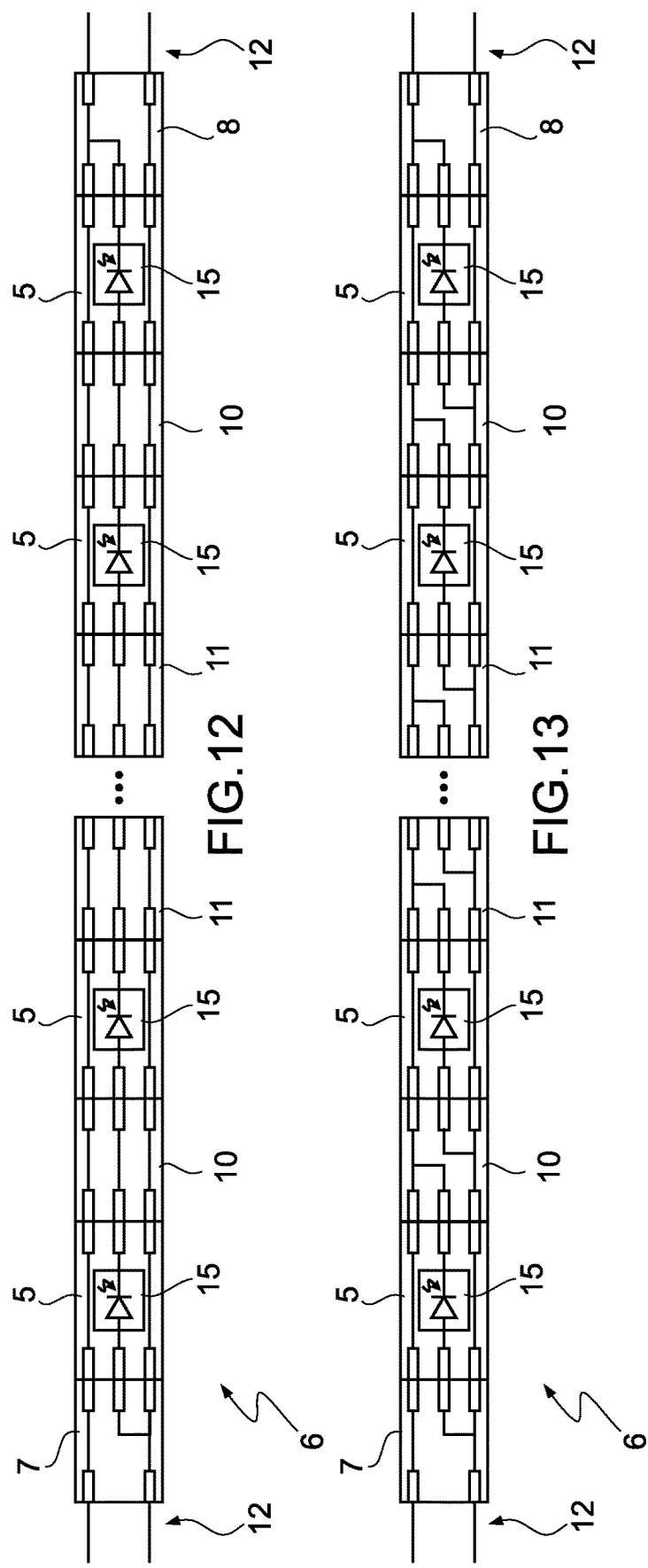
FIG.12
FIG.13

PHOTOVOLTAIC CONVERTER

CROSS-REFERENCE TO RELATED APPLICATIONS

This Patent Application is a national stage application, filed under 35 U.S.C. § 371 of International Patent Application No. PCT/IB2021/052616, filed on Mar. 30, 2021, which claims priority from Italian Patent Application No. 102020000006622, filed on Mar. 30, 2020, the entire disclosure of each of which is incorporated herein by reference.

BACKGROUND OF THE DISCLOSURE

1. Field of the Disclosure

The present invention relates to a photovoltaic converter, particularly for electric power-generating panels based on luminescent solar concentrators. The invention may be advantageously applied, although not exclusively, for making architectural elements for the civil and industrial construction business, such as windows, glass walls, and roofing elements for greenhouses.

2. Description of Related Art

As is known, generating panels of this type are systems comprising a luminescent solar concentrator (LSC) and a photovoltaic converter. The luminescent solar concentrator is in the form of a slab made of a material semi-ransparent to the solar radiation (from the infra-red to the ultraviolet), containing colour centres and selectively absorbing a portion of the solar spectrum. The absorbed luminous radiation may be re-emitted in a substantially isotropic manner from the colour centres as a fluorescence radiation and is partially conveyed towards the perimeter of the slab as a result of total internal reflection (namely, the slab serves as a waveguide). The photovoltaic converter comprises a plurality of photovoltaic-cell devices arranged along at least a part of the perimeter of the slab and connected to each other according to the design preferences. The fluorescence radiation conveyed towards the perimeter of the luminescent solar concentrator is collected by the photovoltaic cells and converted into electricity, in particular into a current proportional to the incident optical power. As mentioned, photovoltaic-cell devices can be connected to each other (in series or in parallel) depending on the design preferences, i.e., depending on the voltages and/or currents intended to be supplied.

A drawback of the known solutions is the lack of flexibility in assembling. In the known photovoltaic converters, the photovoltaic-cell devices are welded on substrates and are coupled along the perimeter of the luminescent solar concentrator directly or by layers serving as impedance adapters. Connections between the cells are made on the spot by welding operations, which are time-consuming and require highly skilled operators. There is therefore a likelihood of assembly mistakes by poorly skilled operators or those not accustomed to specific electrical and/or electronic working operations.

In some solutions, tailor-made components with a plurality of photovoltaic cells fixed on a same support are pre-assembled and applied on the slabs. Such types of solutions need to be designed individually and are unlikely to be produced on a large-scale basis. For instance, in the field of photovoltaic systems for architectural integration, the lack of dimensional standards does not allow for identifying a type of photovoltaic-cell device capable of fulfilling all the installation needs. The lack of flexibility thus affects the costs and the complexity of either production processes or of managing a necessarily very wide range of products, however, with relatively inefficient scale economies.

SUMMARY OF THE DISCLOSURE

It is an aim of the present invention to provide a photovoltaic converter able to overcome or at least alleviate the disclosed limitations.

According to the present invention, there is therefore provided a photovoltaic converter for electric power generating panels comprising:
- a plurality of photovoltaic modules, each comprising a substrate, extending along a main direction from a first end to a second end, and a plurality of photovoltaic devices, arranged on the substrate in succession along the main direction; and
- at least a bridge module insertion-connecting a respective upstream photovoltaic module and a respective downstream photovoltaic module.

The modular creation of the photovoltaic converter by insertion-connected bridge modules has several advantages. Firstly, the insertion-connection, with no welding required, simplifies the assembly operation and prevents defects and malfunctions from occurring in case welds are not properly made. Furthermore, it is possible to manufacture identical modules and assemble them according to the design preferences to obtain the desired characteristics in relation to the maximum voltage and current supplied by the photovoltaic converter. The use of a single type of photovoltaic module in various combinations makes it possible to advantageously reduce costs both for bigger production scale economies, and for simplifying the warehouse management, which must have a small number of components.

According to an aspect of the invention, the photovoltaic modules are arranged in succession and aligned in a longitudinal direction, according to their respective main directions.

According to an aspect of the invention, each photovoltaic module comprises an anode connector at the first end of the substrate and a cathode connector at the second end of the substrate. The bridge module is configured to couple to the cathode connector of the respective upstream photovoltaic module to the anode connector of the respective downstream photovoltaic module.

According to an aspect of the invention, in each photovoltaic module, the anode connector comprises a module anode terminal, and the cathode connector comprises a module cathode terminal, and the photovoltaic devices are connected in series between the module anode terminal and the module cathode terminal.

According to an aspect of the invention, in each photovoltaic module, the anode connector comprises a first line terminal and a second line terminal and the cathode connector comprises a third line terminal and a fourth line terminal, and wherein each photovoltaic module comprises a first conductive line, extending on the substrate between the first line terminal and the third line terminal, and a second conductive line, extending on the substrate between the second line terminal and the fourth line terminal.

The structure of the photovoltaic modules makes it possible to connect them in different configurations, also thanks to the fact that the first connection lines and the second connection lines of distinct photovoltaic modules may be easily connected to form lines that are common to the whole photovoltaic converter or at least a whole string of photovoltaic modules.

According to an aspect of the invention, the bridge module comprises one first bridge connector and one second bridge connector, each having a respective first bridge terminal, a respective second bridge terminal and a respective third bridge terminal; and wherein the first bridge terminal, the second bridge terminal and the third bridge terminal of the first bridge connector are respectively connected to the first line terminal, second line terminal and module cathode terminal of the upstream photovoltaic module and the first bridge terminal, the second bridge terminal and the third bridge terminal of the second bridge connector are respectively connected to the third line terminal, fourth line terminal an module anode terminal of the downstream photovoltaic module.

The structure of the bridge module makes it possible to immediately connect two photovoltaic modules without any further components, making the photovoltaic converter assembly easier.

According to an aspect of the invention, the first bridge terminal and the second bridge terminal of the first bridge connector are respectively connected to the first bridge terminal and the second bridge terminal of the second bridge connector.

Thereby, the bridge module connects the first connection lines and the second connection lines of distinct photovoltaic modules to form lines that are common to the entire photovoltaic converter.

According to an aspect of the invention, the converter comprises a plurality of bridge modules, each connecting a respective upstream photovoltaic module and a respective downstream photovoltaic module.

Advantageously, the photovoltaic modules may be combined flexibly and in the desired number simply by using a proper number of bridge modules.

According to an aspect of the invention, the bridge modules comprise at least a series bridge module, connecting the respective upstream photovoltaic module and the respective downstream photovoltaic module with a series-type connection.

According to an aspect of the invention, in the series bridge module, the third bridge terminal of the first bridge connector is connected to the third bridge terminal of the second bridge connector.

According to an aspect of the invention, the bridge modules comprise at least a parallel bridge module, connecting the respective upstream photovoltaic module and the respective downstream photovoltaic module with a parallel-type connection.

According to an aspect of the invention, in the parallel bridge module, in the first bridge connector, the third bridge terminal is connected to the first bridge terminal, and in the second bridge connector, the third bridge terminal is connected to the second bridge terminal.

The series-type and parallel-type bridge modules are sufficient to combine the photovoltaic modules in any desired configuration. In particular, the photovoltaic modules of a same string may be connected in series-parallel combinations, all of them in series or parallel or between the first conductive line and the second conductive line. In the series-parallel configurations, consecutive photovoltaic modules are connected to groups in series by series bridge modules. Furthermore, the groups of photovoltaic modules in series are connected in parallel between the first conductive line and the second conductive line by parallel bridge modules connected at the beginning and the end of each group. The groups may contain an arbitrary number of photovoltaic modules. The number of photovoltaic modules in each group and the number of groups of photovoltaic modules may be selected to determine the maximum voltage and the maximum current that the photovoltaic converter is able to supply. Only two types of components thus enable a very high flexibility, to the benefit of the reduction in production costs and management.

According to an aspect of the invention, the converter comprises:
- at least a string defined by a plurality of photovoltaic modules consecutively arranged and connected through at least one of the bridge modules;
- a string beginning module, connected to the photovoltaic module at a beginning end of the string and having a first distribution connector and a string beginning connector; and
- a string finishing module, connected to the photovoltaic module at a finishing end of the string and having a second distribution connector and a string finishing connector.

String beginning and finishing modules are coupled to the photovoltaic modules exactly as bridge modules, to the benefit of ease of assembly.

According to an aspect of the invention, the photovoltaic modules comprise a protection device in parallel to at least one of the photovoltaic devices.

The expedient allows the functioning of the photovoltaic converter also in case of breakdown of the single photovoltaic module and improves the performance in situations of partial shading.

According to the present invention, there is also provided an electric power generating panel, comprising:
- a luminescent solar concentrator having a first face, a second face, and a perimeter side around the first face and the second face;
- a photovoltaic converter as mentioned above applied to at least a portion of the perimeter side of the luminescent solar concentrator.

BRIEF DESCRIPTION OF THE DRAWINGS

For a better understanding of the invention, some embodiments thereof will now be disclosed, for merely illustrative and non-limiting purposes and with reference to the enclosed drawings, wherein:

FIG. 2 is a simplified schematic view of a photovoltaic converter string of FIG. 1 in accordance with an embodiment of the present invention;

FIG. 3 is an enlarged plan view from above of a first component of the photovoltaic converter of FIG. 1;

FIG. 4 is an enlarged plan view from above of a variant of the first component of the photovoltaic converter of FIG. 1;

FIG. 5 is an enlarged plan view from below of a second component of the photovoltaic converter of FIG. 1;

FIG. 6 is an enlarged plan view from below of a third component of the photovoltaic converter of FIG. 1;

FIG. 7 is an enlarged plan view from below of two samples of the first component and second component of the photovoltaic converter of FIG. 1, during the assembly step;

FIG. 8 is a side view of two samples of the first component and second component of the photovoltaic converter of FIG. 1, having been assembled;

FIG. 9 is a side view of two samples of a further variant of the first component and second component of the photovoltaic converter of FIG. 1, having been assembled;

FIG. 10 is an enlarged plan view from below of a fourth component of the photovoltaic converter of FIG. 1;

FIG. 11 is an enlarged plan view from below of a fifth component of the photovoltaic converter of FIG. 1;

FIG. 12 is a simplified schematic view of a photovoltaic converter string of FIG. 1 in accordance with a different embodiment of the present invention;

FIG. 13 is a simplified schematic view of a photovoltaic converter string of FIG. 1 in accordance with a further embodiment of the present invention;

DETAILED DESCRIPTION OF THE DISCLOSURE

Figure 1:
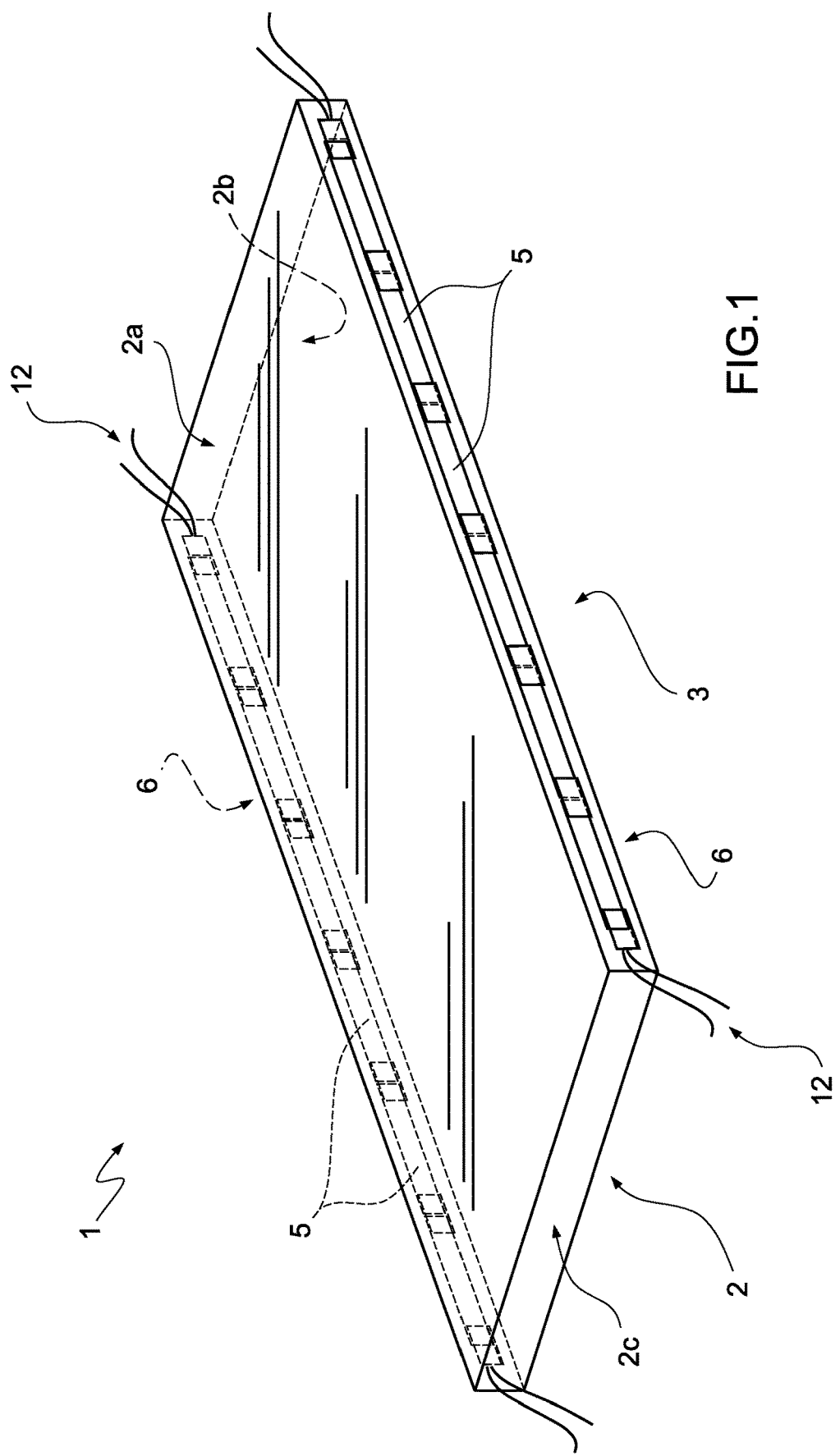
FIG. 1 is a perspective view of a solar concentrator comprising a photovoltaic converter.

With reference to FIG. 1, an electric power generating panel is indicated as a whole by reference number 1 and comprises a luminescent solar concentrator 2 and a photovoltaic converter 3 made according to an embodiment of the present invention. The luminescent solar concentrator 2 is in the form of a slab comprising a matrix made of a material that is transparent or semi-transparent to the concerned radiations (such as transparent glass or a transparent polymer material), and one or more photo-luminescent compounds generally selected, for instance, from organic compounds, metal complexes, inorganic compounds (such as, rare-earth elements), quantum dots (QDs). The luminescent solar concentrator 2 has, for instance, a square or rectangular shape, with sides non-limitedly ranging from 50 cm to 100 cm, and has a first face 2a, a second face 2b, and perimetral (or lateral) side 2c around the first face 2a and the second face 2b.

The photovoltaic converter 3 is attached to a portion of the perimeter side of the luminescent solar concentrator 2, for instance, two longer sides, to receive the luminescence radiation conveyed through the luminescent solar concentrator 2 by total reflection between the first face 2a and the second face 2b until the perimeter side 2c. The photovoltaic converter 3 may be, for instance, glued, possibly with an interposed optic impedance adapter layer, not shown.

The photovoltaic converter 3 comprises a plurality of photovoltaic modules 5, which are aligned and arranged in succession along the perimeter side 2c of the luminescent solar concentrator 2. Even though the photovoltaic converter 3 may include only two photovoltaic modules 5, there is advantageously a higher number thereof. Groups of consecutive photovoltaic modules 5 connected to each other are organised in one or more strings 6, for instance, one for each side greater than the perimeter side 2c.

FIG. 2 shows an example of one of the strings 6 of the photovoltaic converter 3. In addition to photovoltaic modules 5, the string 6 comprises a string beginning module 7, a string finishing module 8, and a plurality of bridge modules, which include series bridge modules 10 and parallel bridge modules 11.

The string beginning module 7 is connected to a distribution line 12 and is coupled to one of the photovoltaic modules 5 arranged at a beginning end of the string 6. The string finishing module 8 is connected to a distribution line 12 and is coupled to one of the photovoltaic modules 5 arranged at a finishing end of the string 6. The distribution line 12 is used to convey the current generated by the photovoltaic modules 5 towards users and/or a power grid distribution network.

Each of the series bridge modules 10 and parallel bridge modules 11 connects a respective upstream photovoltaic module 5 (relative to the direction from the string beginning to the string finishing) to a respective downstream photovoltaic module 5.

FIG. 3 shows one of the photovoltaic modules 5, which will be hereinafter referred to, considering that all the photovoltaic modules 5 of the photovoltaic converter 3 have identical structure. The photovoltaic module 5 comprises a substrate 14 extending along a main direction D from a first end to a second end. A plurality of photovoltaic devices 15, housed on the substrate 14 in succession along the main direction D. The photovoltaic modules 5 of the string 6 are aligned in a longitudinal direction according to the respective main directions D, which are common. For instance, the substrate 14 may be a printed circuit board, and the photovoltaic modules 15 may be photovoltaic cells. For merely exemplary and non-limiting purposes, a photovoltaic module 5 may be, for instance, 25 cm long, and its photovoltaic devices 15 may generate as a whole a maximum voltage of 14 V.

Furthermore, the photovoltaic module 5 comprises an anode connector 17 and a cathode connector 18, respectively, at the first end and the second end of the substrate 14. The anode connector 17 comprises a first line terminal 17a, a second line terminal 17b, and a module anode terminal 17c. The cathode connector 18 comprises a third line terminal 18a, a fourth line terminal 18b, and a module cathode terminal 18c.

A first conductive line 20 and a second conductive line 21 extend on the substrate 14 respectively between the first line terminal 17a and the third line terminal 18a, and between the second line terminal 17b and the fourth line terminal 18b.

The photovoltaic devices 15 are connected in series between the module anode terminal 17c and the module cathode terminal 18c. Conductive lines 20, 21 extend in parallel to the succession of the photovoltaic devices 15 on opposite sides thereof, as in FIG. 3, or adjacent to one another, as in FIG. 4. Conductive lines 20, 21 may also consist of several conductive layers within the substrate 14 (if the substrate is multilayer), and the connections between terminals and devices may be made by pass-through metallisation or vertical contacts.

Protection devices 19, such as diodes or thyristors, may be connected in parallel to devices 15, to allow the functioning of the photovoltaic converter 3 even in case of breakdown of the single photovoltaic module 5 or in case of total or partial shading of the photovoltaic module 5 or of the string 6. Each photovoltaic module 5 may comprise a plurality of protection devices 19, each protection device 19 may be connected in parallel to different groups of photovoltaic devices 15.

The anode connector 17 and the cathode connector 18 are insertion- or interlock-type connectors, in this case, female-type.

One of the series bridge modules 10, all identical to each other, is shown in FIG. 5. The series bridge module 10 comprises a substrate 22, for instance a printed circuit board, a first bridge connector 23 and a second bridge connector 24, having each a respective first bridge terminal 23a, 24a, a respective second bridge terminal 23b, 24b and a respective third bridge terminal 23c, 24c. The homologous terminals of the first bridge connector 23 and the second bridge connector 24 are directly connected to each other. Therefore, the first bridge terminal 23a, the second bridge terminal 23b, and the third bridge terminal 23c of the first bridge connector 23 are directly connected respectively to the first bridge terminal 24a, the second bridge terminal 24b, and the third bridge terminal 24c of the second bridge connector 24. Furthermore, the first bridge connector 23 and the second bridge connector 24 are configured to connect respectively to the cathode connector 18 of the upstream photovoltaic module 5 and the anode connector 17 of the downstream photovoltaic module 5. Each series bridge module 10 connects the respective upstream photovoltaic module 5 and the respective downstream photovoltaic module 5 with a series-type connection, as shown in FIG. 2. In detail, the first bridge terminal 23a, the second bridge terminal 23b and the third bridge terminal 23c of the first bridge connector 23 are respectively connected to the third line terminal 18a, the fourth line terminal 18b and to the module cathode terminal 18c of the upstream photovoltaic module 5 and the first bridge terminal 24a, the second bridge terminal 24b and the third bridge terminal 24c of the second bridge connector 24 are respectively connected to the first line terminal 17a, the second line terminal 17b and the module anode terminal 17c of the downstream photovoltaic module 5.

In an embodiment, the series bridge module 10 is electrically and structurally symmetrical (for 180° rotations relative to the centre) and the first bridge connector 23 and the second bridge connector 24 may be equally connected to a respective anode connector 17 or a respective cathode connector 18. By contrast, if for instance the conductive lines 20, 21 of the photovoltaic modules 5 are not arranged on opposite sides of the photovoltaic devices 15, but are adjacent one another as in FIG. 4, the photovoltaic modules 5 and the series bridge module 10 may be provided with a safety device (not shown) preventing the connection between the first bridge connector 23 and the anode connector 17 and between the second bridge connector 24 and the cathode connector 18.

One of the parallel bridge modules 11, all identical to each other, is shown in FIG. 6. The parallel bridge module 11 comprises a substrate 25, for instance a printed circuit board, a first bridge connector 27 and a second bridge connector 28, having each a respective first bridge terminal 27a, 28a, a respective second bridge terminal 27b, 28b and a respective third bridge terminal 27c, 28c. The first bridge terminal 27a and the second bridge terminal 27b of the first bridge connector 27 are directly connected respectively to the first bridge terminal 28a and the second bridge terminal 28b of the second bridge connector 28. Furthermore, in the first bridge connector 27, the third bridge terminal 27c is connected to the first bridge terminal 27a. In the second bridge connector 28 the third bridge terminal 28c is connected to the second bridge terminal 28b.

The first bridge connector 27 and the second bridge connector 28 are configured to connect respectively to the cathode connector 18 of the upstream photovoltaic module 5 and the anode connector 17 of the downstream photovoltaic module 5. Each parallel bridge module 11 connects the respective upstream photovoltaic module 5 and the respective downstream photovoltaic module 5 with a parallel-type connection, as shown in FIG. 2. In detail, the first bridge terminal 27a, the second bridge terminal 27b and the third bridge terminal 27c of the first bridge connector 27 are respectively connected to the third line terminal 18a, the fourth line terminal 18b and the module cathode terminal 18c of the upstream photovoltaic module 5 and the first bridge terminal 28a, the second bridge terminal 28b and the third bridge terminal 28c of the second bridge connector 28 are respectively connected to the first line terminal 17a, the second line terminal 17b and the module anode terminal 17c of the downstream photovoltaic module 5.

In practice, the series bridge modules 10 and the parallel bridge modules 11 connect the first conductive lines 20 of all the photovoltaic modules 5 between each other and all the second conductive lines 21 between each other. Therefore, electrically, the first conductive lines 20 and the second conductive lines 21 are common to the photovoltaic modules 5 of the string 6.

Each series bridge module 10 connects the photovoltaic devices 15 (module cathode terminal 18c) of the respective upstream photovoltaic module 5 in series to photovoltaic devices 15 (module anode terminal 17c) of the respective downstream module 5.

Each parallel bridge module 11 connects the module cathode terminal 18c of the upstream photovoltaic module 5 to the second conductive lines 21 (electrically common to all the photovoltaic modules 5 of the string 6) and the module anode terminal 17c of the downstream photovoltaic module 5 to the first conductive lines 20 (electrically common to all the photovoltaic modules 5 of the string 6). In practice, each parallel bridge module 11 defines, in a parallel connection, the connection to the higher potential line of the anode terminal of a photovoltaic module 5 and the connection to the lower potential line of the cathode terminal of an adjacent photovoltaic module 5.

In the herein described embodiment, the first bridge connector 23 and the second bridge connector 24 of the series bridge modules 10 and of the parallel bridge modules 11 are of the male type and connect to respective female connectors (cathode connector 18 and anode connector 17 respectively) by insertion in parallel to the respective substrate 22 and substrate 14 of the respective photovoltaic modules 5, as shown in FIGS. 7 and 8. The first bridge connector 23 and the second bridge connector 24 may also be of a different type, arranged in a comb-like manner (FIG. 9) by insertion in a direction perpendicular to the substrate 22 and substrate 14 of the respective photovoltaic modules 5 into correspondingly oriented female connectors. The connection of the first bridge connector 23 and of the second bridge connector 24 of the series bridge modules 10 and of the parallel bridge modules 11 with the cathode connectors 18 and anode connectors 17 of the photovoltaic modules 5 is, in any case, obtained without welding.

The string beginning module 7 (FIG. 10) has a first distribution connector 30, connected to the distribution line 12, and a string beginning connector 31.

The string beginning connector 31 is coupled to the anode connector 17 of the photovoltaic module 5 at the beginning end of the string 6. With reference to such anode connector 17, the string beginning connector 31 has a respective first line terminal 31a connected to the first line terminal 17a; a respective second line terminal 31b connected to the second line terminal 17b; and a string anode terminal 31c connected to the module anode terminal 17c. Furthermore, the first line terminal 31a and the second line terminal 31b of the string beginning module 7 are respectively connected to a first distribution terminal 30a and a second distribution terminal 30b of the first distribution connector 30.

The string finishing module 8 (FIG. 11) has a second distribution connector 32, connected to the distribution line 12, and a string finishing connector 33.

The string finishing connector 33 is coupled to the cathode connector 18 of the photovoltaic module 5 at the finishing end of the string 6. With reference to such cathode connector 18, the string finishing connector 33 has a respective first line terminal 33a connected to the third line terminal 18a; a respective second line terminal 33b connected to the fourth line terminal 18b; and a string cathode terminal 33c connected to the module cathode terminal 18c. Furthermore, the first line terminal 33a and the second line terminal 33b of the string finishing module 8 are respectively connected to a first distribution terminal 32a and a second distribution terminal 32b of the second distribution connector 32.

Figure 14:
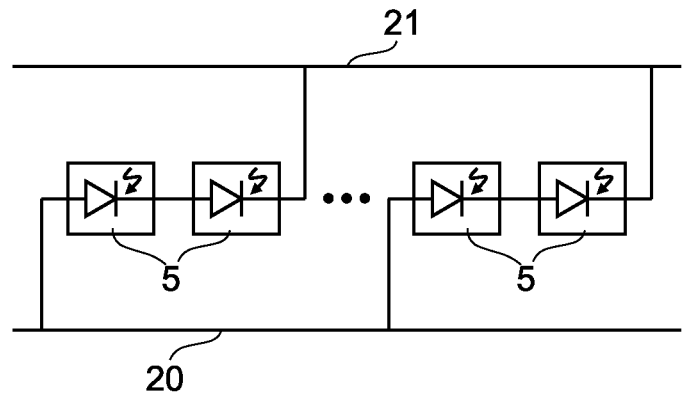
FIG. 14 is an equivalent circuit diagram of the string of FIG. 2.
Figure 15:
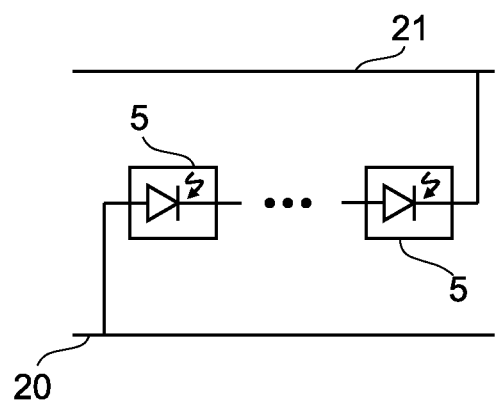
FIG. 15 is an equivalent circuit diagram of the string of FIG. 12.
Figure 16:
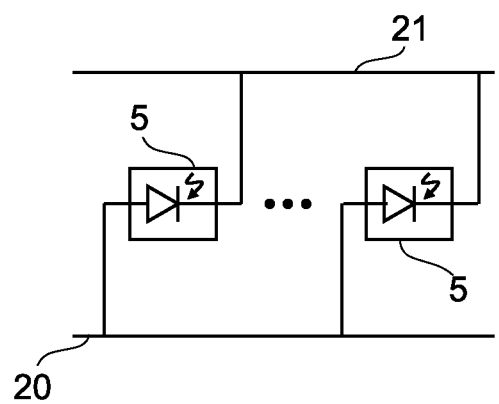
FIG. 16 is an equivalent circuit diagram of the string of FIG. 13.

Thanks to the bridge modules 10, 11, it is possible to combine three or more identical photovoltaic modules 5 between each other when being assembled in an extremely flexible way to obtain voltages and currents required by the specific application. In particular, the photovoltaic module 5 of a same string 6 may be connected in series-parallel combinations (as shown in FIGS. 2 and 14), all in series (FIGS. 12 and 15) or all in parallel (FIGS. 13 and 16) between the first conductive line 20 and the second conductive line 21. In particular, in the configuration of FIGS. 2 and 12 the photovoltaic modules 5 are connected in series in pairs by series bridge modules 10. Furthermore, the consecutive photovoltaic module pairs 5 are connected in parallel between the first conductive line 20 and the second conductive line 21 by parallel bridge modules 11, which are connected at the beginning and the end of each series of photovoltaic modules 5. It must also be understood that the series may contain any number of photovoltaic modules 5. The number of photovoltaic modules 5 in each series and the number of series of photovoltaic modules 5 respectively determine the maximum voltage and maximum current that the photovoltaic converter 3 is able to supply.

It is finally clear that modifications and variants can be made to the disclosed photovoltaic converter, without departing from the scope of the present invention, as defined in the enclosed claims.

The invention claimed is:

1. A photovoltaic converter for electric power generating panels comprising:
    a plurality of photovoltaic modules, each comprising a substrate, extending along a main direction from a first end to a second end, and a plurality of photovoltaic devices arranged on the substrate in succession along the main direction; and
    at least a bridge module insertion-connecting a respective upstream photovoltaic module and a respective downstream photovoltaic module,
    wherein the photovoltaic modules are arranged in succession and aligned in a longitudinal direction according to the respective main directions,
    wherein each photovoltaic module comprises an anode connector at the first end of the substrate and a cathode connector at the second end of the substrate,
    wherein the bridge module is configured to couple to the cathode connector of the respective upstream photovoltaic module and to the anode connector of the respective downstream photovoltaic module,
    wherein the anode connector in each photovoltaic module comprises a module anode terminal, a first line terminal, and a second line terminal,
    wherein the cathode connector in each photovoltaic module comprises a module cathode terminal, a third line terminal, and a fourth line terminal,
    wherein the photovoltaic devices are series-connected between the module anode terminal and the module cathode terminal,
    wherein each photovoltaic module comprises a first conductive line extending on the substrate between the first line terminal and the third line terminal, and a second conductive line extending on the substrate between the second line terminal and the fourth line terminal,
    wherein the bridge module comprises a first bridge connector and a second bridge connector, each having a respective first bridge terminal, a respective second bridge terminal, and a respective third bridge terminal
    wherein the first bridge terminal, the second bridge terminal, and the third bridge terminal of the first bridge connector are respectively connected to the first line terminal, to the second line terminal, and to the module cathode terminal of the upstream photovoltaic module, and
    wherein the first bridge terminal, the second bridge terminal, and the third bridge terminal of the second bridge connector are respectively connected to the third line terminal, to the fourth line terminal, and to the module anode terminal of the downstream photovoltaic module.

2. The photovoltaic converter according to claim 1, wherein the first bridge terminal and the second bridge terminal of the first bridge connector are respectively connected to the first bridge terminal and to the second bridge terminal of the second bridge connector.

3. The photovoltaic converter according to claim 2, further comprising a plurality of bridge modules, each connecting a respective upstream photovoltaic module and a respective downstream photovoltaic module.

4. The photovoltaic converter according to claim 3, wherein the plurality of bridge modules comprise at least a series bridge module connecting the respective upstream photovoltaic module and the respective downstream photovoltaic module by a series-type connection.

5. The photovoltaic converter according to claim 4, wherein, in the series bridge module, the third bridge terminal of the first bridge connector is connected to the third bridge terminal of the second bridge connector.

6. The photovoltaic converter according to claim 3, wherein the plurality of bridge modules comprise at least a parallel bridge module connecting the respective upstream photovoltaic module and the respective downstream photovoltaic module by a parallel-type connection.

7. The photovoltaic converter according to claim 6, wherein, in the parallel bridge module, in the first bridge connector, the third bridge terminal is connected to the first bridge terminal, and in the second bridge connector, the third bridge terminal is connected to the second bridge terminal.

8. The photovoltaic converter according to claim 4,
    wherein the plurality of photovoltaic modules comprise at least a first photovoltaic module, a second photovoltaic module, and a third photovoltaic module consecutively arranged, and
    wherein the second photovoltaic module is connected to the first photovoltaic module and to the third photovoltaic module through a respective series bridge module and a respective parallel bridge module.

9. The photovoltaic converter according to claim 1, further comprising:
    at least a string defined by a plurality of photovoltaic modules consecutively arranged and connected through at least one of the bridge modules;
    a string beginning module connected to the photovoltaic module at a beginning end of the string and having a first distribution connector and a string beginning connector; and a string finishing module connected to the photovoltaic module at a finishing end of the string and having a second distribution connector and a string finishing connector.

10. The photovoltaic converter according to claim 9, wherein the first distribution connector and the second distribution connector have a respective first distribution terminal and a respective second distribution terminal configured for connection to a grid and/or to user devices, wherein the string beginning connector of the string beginning module has a respective first line terminal connected to the first distribution terminal of the first distribution connector and to the first line terminal of the anode connector of the photovoltaic module at the beginning end of the string, a respective second line terminal connected to the second distribution terminal of the first distribution connector and to the second line terminal of the anode connector of the photovoltaic module at the beginning end of the string, and a string anode terminal connected to the module anode terminal of the anode connector of the photovoltaic module at the beginning end of the string, and wherein the string finishing connector has a respective first line terminal connected to the first distribution terminal of the second distribution connector and to the third line terminal of the cathode connector of the photovoltaic module at the finishing end of the string, a respective second line terminal connected to the second distribution terminal of the second distribution connector and to the fourth line terminal of the cathode connector of the photovoltaic module at the finishing end of the string, and a string cathode terminal connected to the module cathode terminal of the cathode connector of the photovoltaic module at the finishing end of the string.

11. The photovoltaic converter according to claim 1, wherein the photovoltaic modules comprise a protection device in parallel to at least one of the photovoltaic devices.

12. An electric power generating panel comprising:
a luminescent solar concentrator having a first face, a second face, and a perimeter side around the first face and to the second face; and
the photovoltaic converter according to claim 1 fitted to at least a portion of the perimeter side of the luminescent solar concentrator.

13. A photovoltaic converter for electric power generating panels comprising:
a plurality of photovoltaic modules, each comprising a substrate, extending along a main direction from a first end to a second end, and a plurality of photovoltaic devices arranged on the substrate in succession along the main direction;
at least a bridge module insertion-connecting a respective upstream photovoltaic module and a respective downstream photovoltaic module,
wherein the photovoltaic modules are arranged in succession and aligned in a longitudinal direction according to the respective main directions,
wherein each photovoltaic module comprises an anode connector at the first end of the substrate and a cathode connector at the second end of the substrate,
wherein the bridge module is configured to couple to the cathode connector of the respective upstream photovoltaic module and to the anode connector of the respective downstream photovoltaic module,
wherein the anode connector in each photovoltaic module comprises a module anode terminal, a first line terminal, and a second line terminal,
wherein the cathode connector in each photovoltaic module comprises a module cathode terminal, a third line terminal, and a fourth line terminal,
wherein the photovoltaic devices are series-connected between the module anode terminal and the module cathode terminal,
wherein each photovoltaic module comprises a first conductive line extending on the substrate between the first line terminal and the third line terminal, and a second conductive line extending on the substrate between the second line terminal and the fourth line terminal;
at least a string defined by a plurality of photovoltaic modules consecutively arranged and connected through at least one of the bridge modules;
a string beginning module connected to the photovoltaic module at a beginning end of the string and having a first distribution connector and a string beginning connector; and
a string finishing module connected to the photovoltaic module at a finishing end of the string and having a second distribution connector and a string finishing connector,
wherein the first distribution connector and the second distribution connector have a respective first distribution terminal and a respective second distribution terminal configured for connection to a grid and/or to user devices,
wherein the string beginning connector of the string beginning module has a respective first line terminal connected to the first distribution terminal of the first distribution connector and to the first line terminal of the anode connector of the photovoltaic module at the beginning end of the string, a respective second line terminal connected to the second distribution terminal of the first distribution connector and to the second line terminal of the anode connector of the photovoltaic module at the beginning end of the string, and a string anode terminal connected to the module anode terminal of the anode connector of the photovoltaic module at the beginning end of the string, and
wherein the string finishing connector has a respective first line terminal connected to the first distribution terminal of the second distribution connector and to the third line terminal of the cathode connector of the photovoltaic module at the finishing end of the string, a respective second line terminal connected to the second distribution terminal of the second distribution connector and to the fourth line terminal of the cathode connector of the photovoltaic module at the finishing end of the string, and a string cathode terminal connected to the module cathode terminal of the cathode connector of the photovoltaic module at the finishing end of the string.

14. An electric power generating panel comprising:
a luminescent solar concentrator having a first face, a second face, and a perimeter side around the first face and to the second face; and
the photovoltaic converter according to claim 13 fitted to at least a portion of the perimeter side of the luminescent solar concentrator.

* * * * *